United States Patent
Choi

(10) Patent No.: US 9,263,237 B2
(45) Date of Patent: Feb. 16, 2016

(54) PLASMA PROCESSING APPARATUS AND METHOD THEREOF

(75) Inventor: Dae-Kyu Choi, Yongin-si (KR)

(73) Assignee: GEN CO., LTD., Gyeonggi-do (KR)

(*) Notice: Subject to any disclaimer, the term of this patent is extended or adjusted under 35 U.S.C. 154(b) by 773 days.

(21) Appl. No.: 13/036,079

(22) Filed: Feb. 28, 2011

(65) Prior Publication Data

US 2012/0211466 A1   Aug. 23, 2012

(30) Foreign Application Priority Data

Feb. 22, 2011  (KR) .......................... 10-2011-0015749

(51) Int. Cl.
*C23C 16/00* (2006.01)
*H01L 21/306* (2006.01)
*H01J 37/32* (2006.01)

(52) U.S. Cl.
CPC ........... *H01J 37/3211* (2013.01); *H01J 37/321* (2013.01)

(58) Field of Classification Search
CPC   H01J 37/321; H01J 37/3211; H01J 37/32119
USPC ....... 118/723 I, 723 IR, 723 AN; 156/345.48, 156/345.49; 315/111.51
See application file for complete search history.

(56) References Cited

U.S. PATENT DOCUMENTS

| 5,435,881 | A  | * | 7/1995  | Ogle ......................... 156/345.42 |
| 5,944,942 | A  | * | 8/1999  | Ogle ......................... 156/345.46 |
| 6,150,628 | A  | * | 11/2000 | Smith et al. ............. 219/121.54 |
| 6,158,384 | A  | * | 12/2000 | Ye et al. ...................... 118/723 I |
| 6,273,022 | B1 | * | 8/2001  | Pu et al. ...................... 118/723 I |
| 6,352,049 | B1 | * | 3/2002  | Yin et al. ............... 118/723 MP |
| 7,264,688 | B1 | * | 9/2007  | Paterson et al. .......... 156/345.34 |
| 2003/0085205 | A1 | * | 5/2003 | Lai et al. ................. 219/121.43 |
| 2006/0102286 | A1 | * | 5/2006 | Kim ......................... 156/345.35 |

* cited by examiner

*Primary Examiner* — Luz Alejandro Mulero
(74) *Attorney, Agent, or Firm* — IP & T Group LLP

(57) ABSTRACT

The following description relates to a plasma processing apparatus and a method thereof. The plasma processing apparatus comprises a first plasma chamber having a first plasma discharge space, a first plasma source for supplying a first activation energy to the first plasma discharge space within the first plasma chamber, a second plasma chamber which is connected to the first plasma chamber and has a second discharge space, and a second plasma source for supplying a second activation energy for inducing inductive coupled plasma to the second plasma discharge space within the second plasma chamber.

10 Claims, 4 Drawing Sheets

PLASMA PROCESSING APPARATUS AND METHOD THEREOF

CROSS-REFERENCE TO RELATED APPLICATION(S)

This application claims the benefit under 35 U.S.C. §119 (a) of Korean Patent Application No. 10-2011-0015749, filed Feb. 22, 2011, in the Korean Intellectual Property Office, the entire disclosure of which is incorporated herein by reference for all purposes.

BACKGROUND

1. Field

The following description relates to a plasma processing apparatus and a method thereof, and more particularly, to a plasma processing apparatus and a method thereof for uniformly processing a substrate using an activated plasma gas.

2. Background

Plasma is a high ionized gas including positive ions and electrons of the same number. Plasma discharge may be used for gas excitation to generate an active gas including ions, free radicals, atoms, and molecules. The active gas is widely used in various fields. In addition, the active gas is variously used in various semiconductor manufacturing processes, for example, etching, deposition, cleaning, ashing, and the like, for manufacturing devices such as an integrated circuit device, a liquid crystal display, a solar cell, and the like.

Plasma sources include various kinds thereof and may correspond to a capacitive coupled plasma source and an inductive coupled plasma source as typical examples. The capacitive coupled plasma source may enhance process productivity in comparison with other plasma sources because of the high accuracy in capacitive coupled control and a high level of ion control ability. However, when a capacitive coupled electrode is enlarged according to the increase of the substrate to be processed, the electrode may be deformed or damaged by deterioration thereof. In this case, the non-uniformity of electric field intensity can cause non-uniformity of plasma density and contamination within a reactor.

In the inductive coupled plasma source, when an area of an inductive coil antenna is increased, it may be difficult to obtain the uniformity of the plasma density. In addition, when the large-sized substrate to be processed is heated at high temperature at once, the surface of the substrate may crumple and shrink and it may be difficult to process uniformly the entire surface of the substrate because of the non-uniformity of the plasma density.

Recently, there has been a demand on an improved plasma processing technique because of various causes including micro-miniaturization of a semiconductor device and the maximization of the substrate to be processed like a silicon wafer substrate, a glass substrate or plastic substrate for manufacturing semiconductor circuits, and development of a new processing target material, and the like. For example, there has been a demand for an improved plasma source and a plasma processing technique having excellent processing ability with respect to the large-sized substrate to be processed.

Furthermore, various semiconductor manufacturing devices may use a laser. The semiconductor manufacturing process using the laser is widely applied to various processes such as deposition, etching, annealing, cleaning, and the like, with respect to the substrate to be processed. The semiconductor manufacturing process using the laser has the problems described above and disadvantages including a high manufacturing cost and an increase of a processing time.

SUMMARY

The following description provides a plasma processing apparatus and a method thereof for enhancing processing efficiency of a substrate to be processed by efficiently generating plasma using a plasma source discharged twice.

In various aspects, there is provided a plasma processing apparatus and a method thereof. The plasma processing apparatus includes: a first plasma chamber having a first plasma discharge space; a first plasma source for supplying a first activation energy to the first plasma discharge space within the first plasma chamber; a second plasma chamber which is connected to the first plasma chamber and has a second plasma discharge space; and a second plasma source for supplying a second activation energy for inducing inductive coupled plasma to the second plasma discharge space within the second plasma chamber.

The first plasma chamber may comprise: a ring-shaped discharge tube having a gas inlet and a gas outlet; and a ring-shaped core around which a coil is wound, the coil being commonly coupled with the ring-shaped discharge tube to be electrically connected with a power supply source.

The second plasma chamber may comprise: a chamber body having the discharge space in the inside thereof; and a substrate support which is installed in the inside of the chamber body and on which a substrate to be processed is loaded.

A gas distribution baffle may be installed between the substrate support and the discharge space.

The second plasma chamber may comprise: a plurality of ferrite cores of which flux inlet/outlet ports are installed toward the inside of the chamber body; and an antenna coil which is wound around each of the ferrite cores to induce the inductive coupled plasma to the inside of the chamber body by receiving the power from the power supply source.

A ceiling of the chamber body may comprise a dielectric window through which the flux of the ferrite cores passes.

The antenna coil wound around each of the ferrite cores may be connected in series or in parallel to the power supply source.

An impedance matching unit may be installed between the power supply source and the antenna coil to perform the impedance matching.

A current balance circuit may be installed between the impedance matching unit and the antenna coil to adjust the balance of the current supplied to the antenna coil.

The substrate support may be biased by a single frequency power source or two or more different frequency power sources.

The plasma processing method includes: activating a gas induced to a first plasma chamber by a first plasma source; supplying the activated gas within the first plasma chamber to the second plasma chamber; activating the gas induced to the second plasma chamber by the inductive coupled second plasma source; and processing the substrate by the activated gas induced to the second plasma chamber.

The first plasma chamber may comprise: a ring-shaped discharge tube having a gas inlet and a gas outlet; and a ring-shaped core having a primary winding which is commonly coupled with the ring-shaped discharge tube to be electrically connected with the power supply source.

The second plasma chamber may comprise: a chamber body having the discharge space in the inside thereof; and a substrate support which is installed in the inside of the chamber body and on which a substrate to be processed is loaded.

The plasma processing method may comprise distributing the activated gas to the substrate to be processed by installing the gas distribution baffle between the substrate support and the discharge space.

The second plasma chamber may comprise: a plurality of ferrite cores of which flux inlet/outlet ports are installed toward the inside of the chamber body; and an antenna coil which is wound around each of the ferrite cores to induce the inductive coupled plasma to the inside of the chamber body by receiving the power from the power supply source.

Other features and aspects may be apparent from the following description, the drawings, and the claims.

BRIEF DESCRIPTION OF THE DRAWINGS

Throughout the drawings and the description, unless otherwise described, the same drawing reference numerals should be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein may be suggested to those of ordinary skill in the art. Also, descriptions of well-known functions and constructions may be omitted for increased clarity and conciseness.

Figure 1:
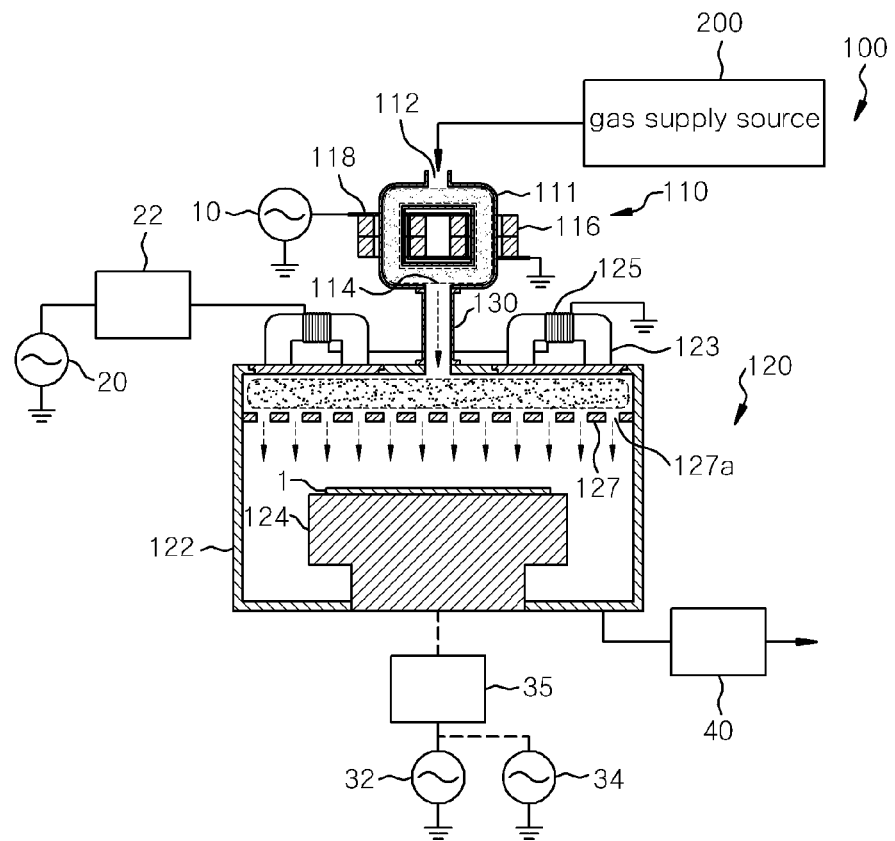
FIG. 1 is a diagram illustrating an example of a plasma processing apparatus.

FIG. 1 illustrates an example of a plasma processing apparatus.

Referring to FIG. 1, a plasma reactor (100) includes a first plasma chamber (110) for generating a firstly activated plasma gas by a first plasma source and a second plasma chamber (120) for generating the activated plasma gas as a secondly activated gas by a second plasma source.

In this example, the first plasma chamber (110) comprises a ring-shaped discharge tube (111) having a gas inlet (112), a gas outlet (114), and a ring-shaped core (116) coupled commonly to the ring-shaped discharge tube (111). A coil (118) connected electrically to a first power supply source (10) is wound around the ring-shaped core (116). The gas supplied from a gas supply source (200) through the gas inlet (112) to the inside of the ring-shaped discharge tube (111) is firstly activated by the plasma induced in the inside of the ring-shaped discharge tube, thereby generating a plasma gas.

The second plasma chamber (120) is connected to the first plasma chamber (110) and receives the plasma gas from the first plasma chamber (110). The second plasma chamber (120) comprises a chamber body (122) having an opening which is formed at an upper part thereof to receive the firstly activated plasma gas and a substrate support (124) which is installed in the inside of the chamber body (122) to support a substrate (1). The inside of the chamber body (122) is a discharge space which generates plasma by secondly activating the plasma gas received from the first plasma chamber (110) by the second plasma source. The substrate may be, for example, a substrate such as a wafer substrate, a glass substrate, a plastic substrate and the like for manufacturing various devices such as a semiconductor device, a display device, a solar cell, and the like.

Figure 2:
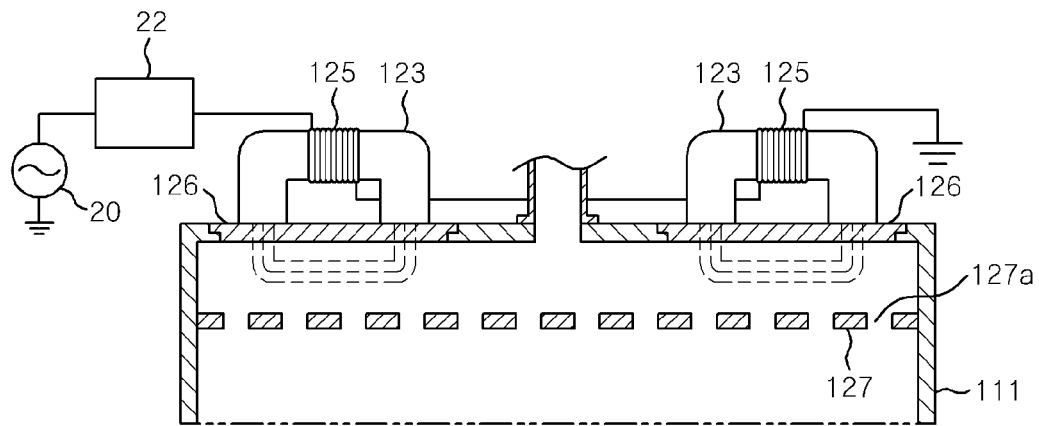
FIG. 2 is a diagram illustrating an example of an upper part of a second chamber illustrated in FIG. 1.
Figure 3:
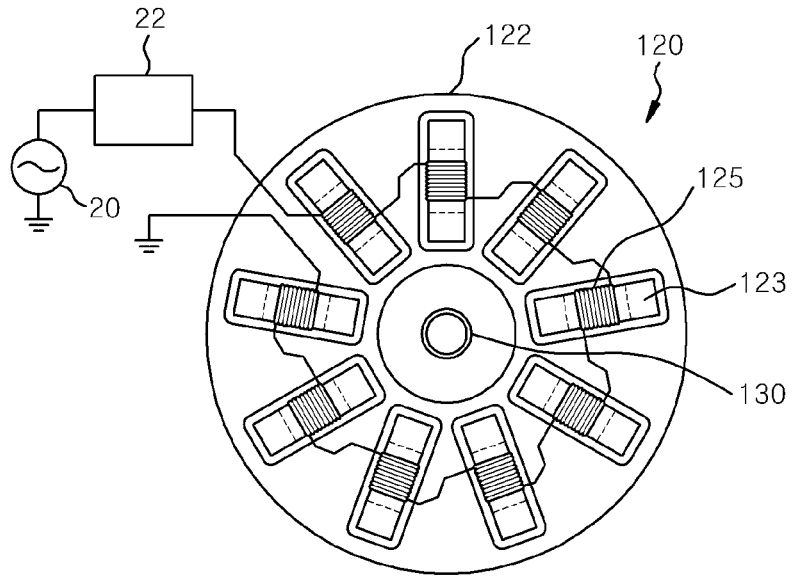
FIG. 3 is a diagram illustrating an upper part of a second plasma chamber illustrated in FIG. 1.

FIG. 2 illustrates an example of the upper part of the second chamber illustrated in FIG. 1 and FIG. 3 also illustrates an example of the upper part of the second plasma chamber illustrated in FIG. 1.

Referring to FIGS. 2 and 3, a plurality of horseshoe-shaped ferrite cores (123) are installed at an upper part of the chamber body (122) so as to direct flux to the inside of the chamber body (122). An antenna coil (125) is wound around the ferrite cores (123). The antenna coil (125) receives the power from a second power supply source (20) and generates the plasma induced to the inside of the chamber body (122). The antenna coil (125) receives a wireless frequency through an impedance matching unit (22) from the second power supply source (20). In this example, a ceiling of the chamber body (122) includes a dielectric window (126) through which the flux of the ferrite cores (123) passes. The dielectric window (126) is installed at the ceiling of the chamber body (122) at which the ferrite cores are positioned. An exhaust pump (40) is installed at a lower part of the chamber body (122).

The substrate support (124) is connected to bias power supply sources (32,34) so as to be biased. For example, two bias power supply sources (32, 34) for supplying different wireless frequency power sources may be electrically connected through an impedance matching unit (35) to the substrate support (124) so as to be biased. A double bias structure of the substrate support (124) enables the plasma reactor (100) to generate easily the plasma in the inside of the plasma reactor (100) and can improve process productivity by improving a plasma ion energy control. As another example, the substrate support (124) can be formed with a single bias structure. As another example, the substrate support (124) can be formed with a modified structure having zero potential without the bias power sources. The substrate support (124) can include an electrostatic chuck. As another example, the substrate support (124) can include a heater.

A gas distribution baffle (127) is installed in the inside of the chamber body (122) so as to distribute uniformly the secondly activated plasma gas to the substrate (1) to be processed. The secondly activated plasma gas is uniformly distributed to the substrate (1) to be processed, through a plurality of holes (127a) which are formed at the gas distribution baffle (127) installed in an upper discharge space of the substrate support (124).

A gas outlet (114) of a ring-shaped discharge tube (111) of the first plasma chamber (110) is connected to the opening of the chamber body of the second plasma chamber (120) through an adapter (130). The adapter (130) includes an insulating section for insulating the ring-shaped discharge tube (111) and the chamber body (122) to each other.

Figure 4:
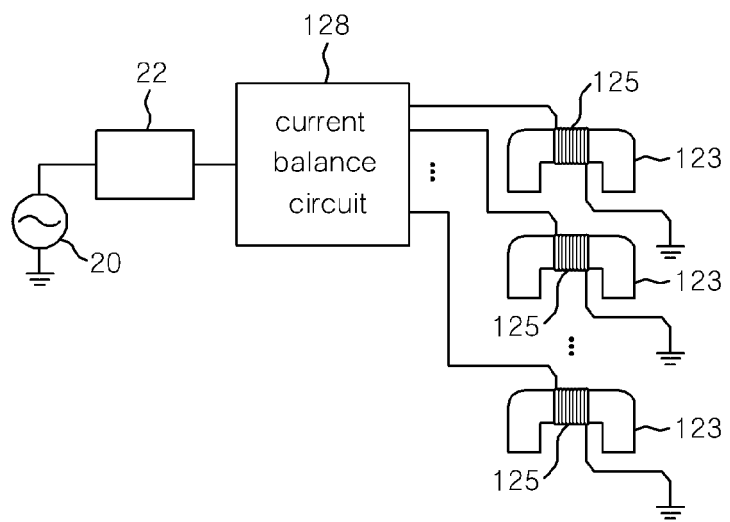
FIG. 4 is a diagram illustrating an example of connecting a current balance circuit to the plasma processing apparatus.

FIG. 4 illustrates an example of connecting a current balance circuit to the plasma processing apparatus.

Referring to FIG. 4, the wireless frequency power source generated from the second power supply source (20) is uniformly distributed to the antenna coil (125) wound around each of the ferrite cores (123) through a current balance distribution circuit (128). The current balance circuit (128) automatically forms the mutual balance of the current supplied to the antenna coil (125) wound around each of the ferrite cores (123). The plasma reactor (100) can uniformly generate the plasma by the antenna coil (125) wound around the ferrite cores (123) by automatically forming the current balance.

Figure 5:
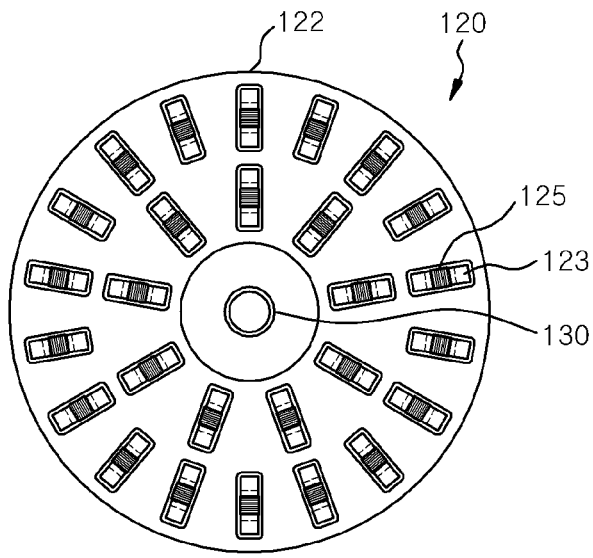
FIGS. 5 and 6 are diagrams illustrating examples of ferrite cores arranged in various shapes.
Figure 6:
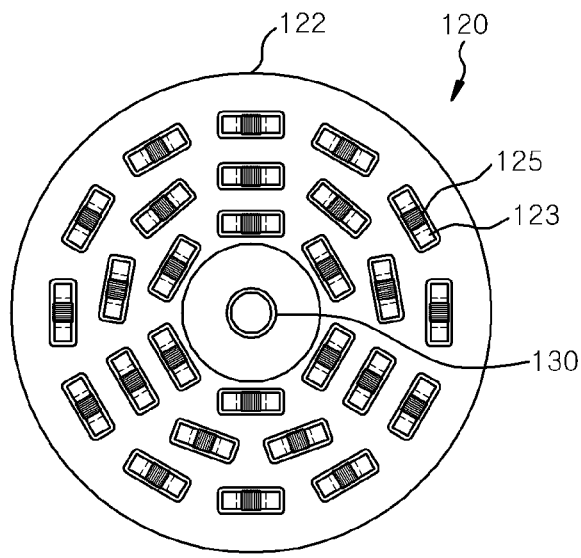

FIGS. 5 and 6 illustrate examples of ferrite cores arranged in various shapes.

Referring to FIGS. 5 and 6, the ferrite cores (123) can be arranged in various shapes on an upper surface of the circular chamber body (122) having the opening formed at a central area thereof. For example, the ferrite cores (123) are arranged in two stages or three stages around a center of the opening of the central area so as to generate the plasma.

Figure 7:
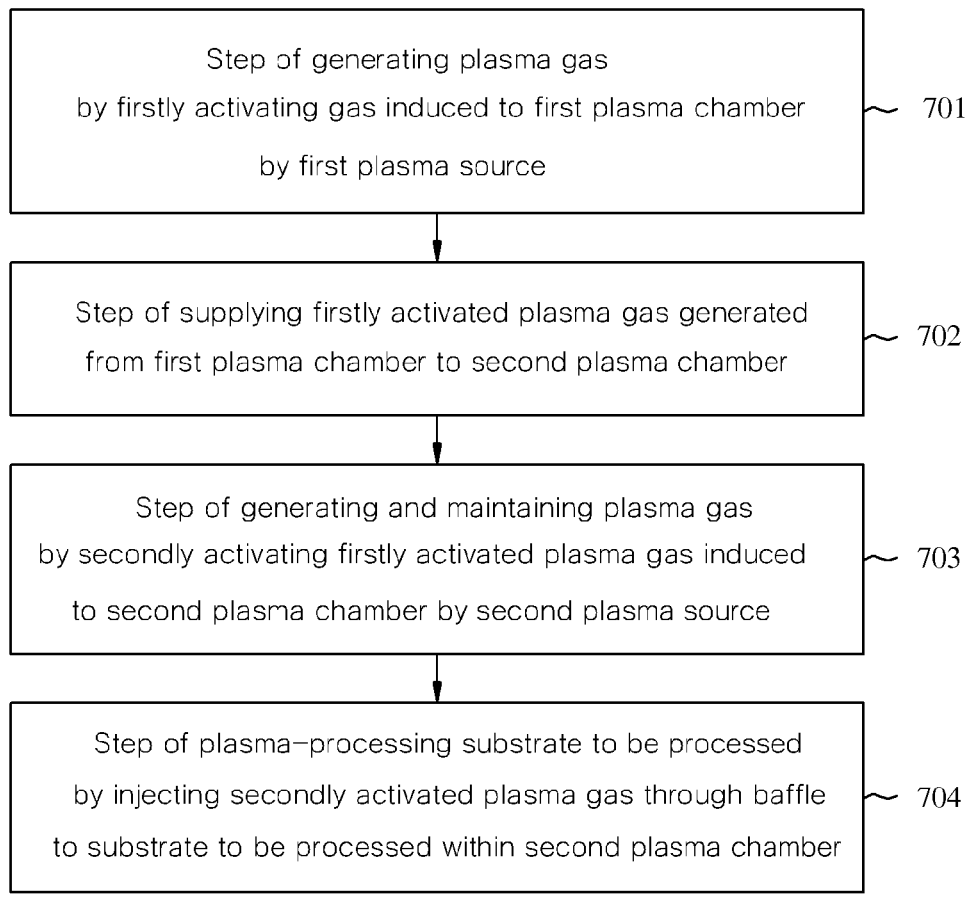
FIG. 7 is a flow chart illustrating an example of a method of processing a substrate using the plasma processing apparatus.

FIG. 7 illustrates a method of processing the substrate using the plasma processing apparatus.

Referring to FIG. 7, the gas is supplied from a gas supply source (200) to the ring-shaped discharge tube (111) of the first plasma chamber (110). The gas received from the gas supply source (200) is firstly activated by the first plasma source generated from the inside of the ring-shaped discharge tube (111), thereby generating the plasma gas, in 701.

The plasma gas which is firstly activated in the first plasma chamber (110) is supplied to the chamber body (122) of the second plasma chamber (120), in 702.

The firstly activated plasma gas provided for the second plasma chamber (120) is secondly activated by the antenna coil (125) wound around the ferrite cores (123), thereby generating the plasma gas. The firstly and secondly activated plasma gases remain in the inside of the chamber body (122), in 703.

The plasma gas which is secondly activated in the second plasma chamber (120) is uniformly injected onto the substrate (1) loaded on the substrate support (124) through the gas distribution baffle (127) installed in the inside therein. Thus, the substrate (1) to be processed is processed by the uniformly injected plasma gas, in 704.

The plasma processing apparatus and the method thereof of the present invention can efficiently process the substrate to be processed by supplying the plasma having high density and uniformity. In addition, the plasma processing apparatus and the method thereof of the present invention can enhance the efficiency of the plasma discharge by fully discharging and maintaining the discharge gas which is not discharged at once since the plasma is doubly generated.

The methods, processes, functions, and software described above may be recorded, stored, or fixed in one or more computer-readable storage media that includes program instructions to be implemented by a computer to cause a processor to execute or perform the program instructions. The media may also include, alone or in combination with the program instructions, data files, data structures, and the like. The media and program instructions may be those specially designed and constructed, or they may be of the kind well-known and available to those having skill in the computer software arts. Examples of computer-readable storage media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The described hardware devices may be configured to act as one or more software modules in order to perform the operations and methods described above, or vice versa. In addition, a computer-readable storage medium may be distributed among computer systems connected through a network and computer-readable codes or program instructions may be stored and executed in a decentralized manner.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

REFERENCE LIST

1: substrate to be processed
10: first power supply source
20: second power supply source
22, 35: impedance matching unit
32, 34: bias power supply source
40: exhaust pump
100: plasma reactor
110: first plasma chamber
111: ring-shaped discharge tube
112: gas inlet
114: gas outlet
116: ring-shaped core
118: coil
120: second plasma chamber
122: chamber body
123: ferrite core
124: substrate support
125: antenna coil
126: dielectric window
127: gas distribution baffle
127a: hole
128: current balance distribution circuit
130: adapter

The invention claimed is:

1. A plasma processing apparatus comprising:
a first plasma chamber comprising a first plasma discharge space;
a first plasma source to supply a first activation energy to the first plasma discharge space within the first plasma chamber;
a second plasma chamber connected to the first plasma chamber via an adapter, the second plasma chamber including a second plasma discharge space;
a second plasma source to supply a second activation energy to the second plasma discharge space to induce inductively coupled plasma in the second plasma discharge space; and
a plurality of ferrite cores located over the second plasma chamber,
wherein each ferrite core, of the plurality of ferrite cores, has a longitudinal axis oriented toward the adapter,
wherein each ferrite core has flux inlet/outlet ports oriented toward the second plasma discharge space, and
wherein a flux extending from each ferrite core flows in the second plasma chamber along the longitudinal axis.

2. The plasma processing apparatus of claim 1, wherein the first plasma chamber comprises:
a ring-shaped discharge tube comprising a gas inlet and a gas outlet; and a ring-shaped core around which a coil is wound, the coil being commonly coupled with the ring-shaped discharge tube to be electrically connected with a power supply source.

3. The plasma processing apparatus of claim 1, wherein the second plasma chamber comprises:

a substrate support, installed in the second plasma discharge space, over which a substrate to be processed is loaded.

4. The plasma processing apparatus of claim 3, wherein a gas distribution baffle is located between the substrate support and the second plasma discharge space.

5. The plasma processing apparatus of claim 3, further comprising:

an antenna coil, wound around each ferrite core, of the plurality of ferrite cores, to induce the inductive coupled plasma to the inside of a second plasma chamber body by receiving the power from the power supply source.

6. The plasma processing apparatus of claim 5, wherein the antenna coil is connected in series or in parallel to the power supply source.

7. The plasma processing apparatus of claim 6, wherein an impedance matching unit is located between the power supply source and the antenna coil to perform the impedance matching.

8. The plasma processing apparatus of claim 7, wherein a current balance circuit is installed between the impedance matching unit and the antenna coil to adjust the balance of the current supplied to the antenna coil.

9. The plasma processing apparatus of claim 3, wherein the substrate support is biased by a single frequency power source or by two or more power sources having different frequencies.

10. The plasma processing apparatus of claim 1, wherein the plurality of ferrite cores are located on a dielectric window through which a flux from the plurality of ferrite cores passes.

* * * * *